(12) United States Patent
Roohparvar et al.

(10) Patent No.: US 8,379,446 B2
(45) Date of Patent: *Feb. 19, 2013

(54) MEMORY CONTROLLER SELF-CALIBRATION FOR REMOVING SYSTEMIC INFLUENCE

(75) Inventors: Frankie F. Roohparvar, Monte Sereno, CA (US); Vishal Sarin, Cupertino, CA (US); Jung-Sheng Hoei, Newark, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/217,492

(22) Filed: Aug. 25, 2011

(65) Prior Publication Data

US 2011/0305090 A1 Dec. 15, 2011

Related U.S. Application Data

(63) Continuation of application No. 12/889,461, filed on Sep. 24, 2010, now Pat. No. 8,023,324, which is a continuation of application No. 11/851,439, filed on Sep. 7, 2007, now Pat. No. 7,817,467.

(51) Int. Cl.
*G11C 11/34* (2006.01)
*G11C 16/04* (2006.01)
(52) U.S. Cl. ......... 365/185.03; 365/185.17; 365/185.18; 365/189.011; 365/189.16
(58) Field of Classification Search ............. 365/185.03, 365/185.17, 185.18, 189.011, 189.16
See application file for complete search history.

(56) References Cited

U.S. PATENT DOCUMENTS

| | | | |
|---|---|---|---|
| 6,507,517 B2 | 1/2003 | Rolandi et al. | |
| 7,295,479 B2 | 11/2007 | Yoon et al. | |
| 7,450,417 B2 | 11/2008 | Kaneko et al. | |
| 7,460,398 B1 | 12/2008 | Roohparvar et al. | |
| 7,724,575 B2 | 5/2010 | Lee et al. | |
| 7,817,467 B2* | 10/2010 | Roohparvar et al. | .... 365/185.03 |
| 7,898,885 B2 | 3/2011 | Sarin et al. | |
| 8,023,324 B2* | 9/2011 | Roohparvar et al. | .... 365/185.03 |
| 2003/0107920 A1 | 6/2003 | Roohparvar | |
| 2005/0273549 A1 | 12/2005 | Roohparvar | |
| 2006/0262624 A1 | 11/2006 | Roohparvar | |
| 2007/0183210 A1 | 8/2007 | Choi et al. | |
| 2007/0189073 A1 | 8/2007 | Aritome | |

* cited by examiner

*Primary Examiner* — Toan Le
(74) *Attorney, Agent, or Firm* — Leffert Jay & Polglaze, P.A.

(57) ABSTRACT

Self-calibration for a memory controller is performed by writing a voltage to a selected cell. Adjacent cells around the selected cell are programmed. After each of the adjacent programming operations, the voltage on the selected cell is read to determine any change in voltage caused by systemic offsets such as, for example, floating gate-to-floating gate coupling. These changes are averaged and stored in a table as an offset for use in adjusting a programming voltage or a read voltage in a particular area of memory represented by the offset. Self calibration method for temperature is determined by writing cells at different temperatures and reading at different temperatures to generate temperature offset tables for the write path and read path. These offset tables are used to adjust for systemic temperature related offsets during programming and during read.

22 Claims, 10 Drawing Sheets

US 8,379,446 B2

MEMORY CONTROLLER SELF-CALIBRATION FOR REMOVING SYSTEMIC INFLUENCE

RELATED APPLICATION

This Application is a Continuation of U.S. application Ser. No. 12/889,461, titled "MEMORY CONTROLLER SELF-CALIBRATION FOR REMOVING SYSTEMIC INFLUENCE," filed Sep. 24, 2010, now U.S. Pat. No. 8,023,324, which is a Continuation of U.S. application Ser. No. 11/851,439, filed Sep. 7, 2007, now U.S. Pat. No. 7,817,467 issued on Oct. 19, 2010, which are commonly assigned and incorporated herein by reference.

TECHNICAL FIELD

The present disclosure relates generally to semiconductor memory and more particularly, in one or more embodiments, to solid state non-volatile memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
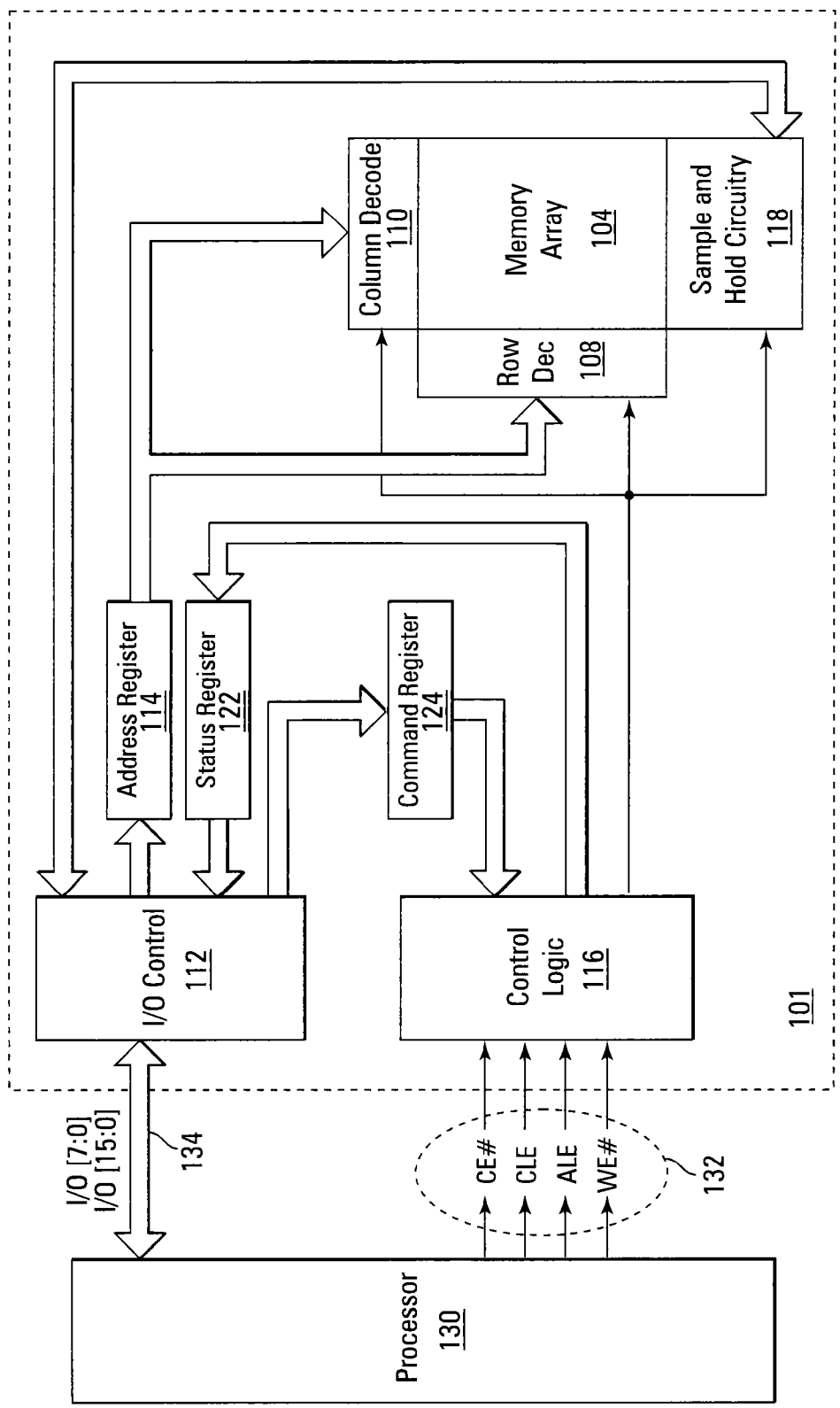
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense, and the scope of the invention is defined only by the appended claims and equivalents thereof.

Traditional solid-state memory devices pass data in the form of binary signals. Typically, a ground potential represents a first logic level of a bit of data (i.e., first bit level), e.g., a '0' data value, while a supply potential represents a second logic level of a bit of data (i.e., second bit level), e.g., a '1' data value. A multi-level cell (MLC) may be assigned, for example, four different threshold voltage ($V_t$) ranges of 200 mV for each range, with each range corresponding to a distinct bit pattern, thereby representing four different bit levels. Typically, a dead space or margin of 0.2V to 0.4V is between each range to keep the $V_t$ distributions from overlapping. If the $V_t$ of the cell is within the first range, the cell may be deemed to store a logical 11 state and is typically considered the erased state of the cell. If the $V_t$ is within the second range, the cell may be deemed to store a logical 10 state. If the $V_t$ is within the third range, the cell may be deemed to store a logical 00 state. And if the $V_t$ is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the $V_t$ of the target memory cell is moved from the $V_t$ range corresponding to the 11 logic state to the $V_t$ range corresponding to the 10 logic state. Following programming of the LSBs, the most-significant bit (MSB) of each cell is programmed in a similar manner, shifting the $V_t$ where necessary. When reading an MLC of a traditional memory device, one or more read operations determine generally into which of the ranges the $V_t$ of the cell voltage falls. For example, a first read operation may determine whether the $V_t$ of the target memory cell is indicative of the MSB being a 1 or a 0 while a second read operation may determine whether the $V_t$ of the target memory cell is indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC.

The memory devices of an illustrative embodiment store data as $V_t$ ranges on the memory cells. In contrast to traditional memory devices, however, the bit patterns of two or more bits per cell are programmed and/or read not as discrete bits, but as complete bit patterns. For example, in a two-bit MLC device, instead of programming a cell's LSB and subsequently programming that cell's MSB, a target threshold voltage may be programmed representing the bit pattern of those two bits. Similarly, instead of utilizing multiple read operations to determine each bit stored on a cell, the threshold voltage of the cell may be determined and passed as a single signal representing the bit pattern of the cell. An advantage of this approach becomes more significant as the bits per cell count is increased.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

During a write operation, target memory cells of the memory array 104 are programmed until voltages indicative of their $V_t$ levels match the levels held in the sample and hold circuitry 118. This can be accomplished, as one example, using differential sensing devices to compare the held voltage level to a threshold voltage of the target memory cell. Programming pulses could be applied to a target memory cell to increase its threshold voltage until reaching or exceeding the desired value. In a read operation, the $V_t$ levels of the target memory cells are passed to the sample and hold circuitry 118 for transfer to an external processor (not shown in FIG. 1).

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [0:7] of I/O bus 134 at I/O control circuitry 112 and are written into command register 124. The addresses are received over input/output (I/O) pins [0:7] of bus 134 at I/O control circuitry 112 and are written into address register 114. The data may be received over input/output (I/O) pins [0:7] for a device capable of receiving eight parallel signals, or input/output (I/O) pins [0:15] for a device capable of receiving sixteen parallel signals, at I/O control circuitry 112 and are transferred to sample and hold circuitry 118. Data also may be output over input/output (I/O) pins [0:7] for a device capable of transmitting eight parallel signals or input/output (I/O) pins [0:15] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
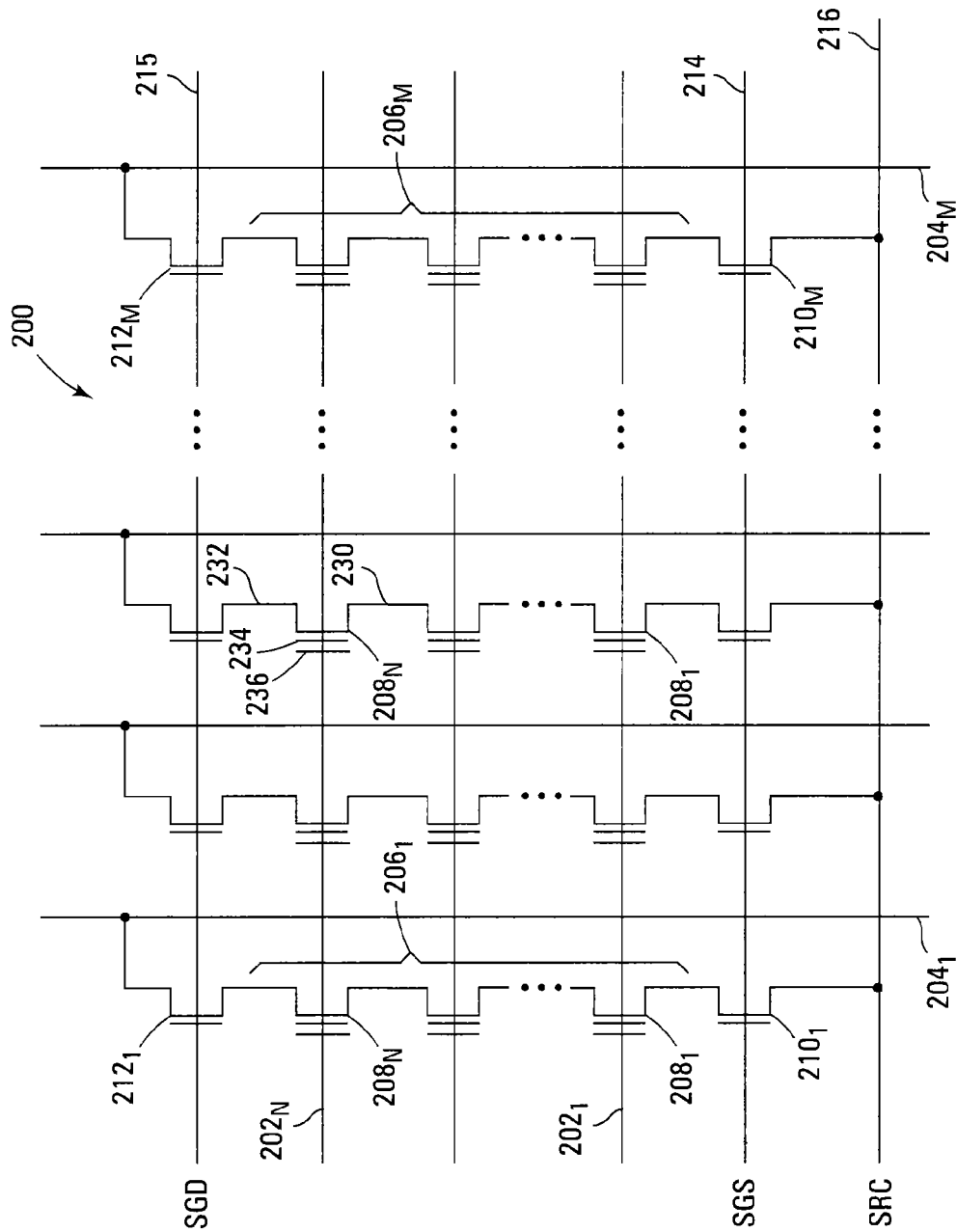
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines 2021 to 202N and intersecting bit lines 2041 to 204M. For ease of addressing in the digital environment, the number of word lines 202 and the number of bit lines 204 are generally each some power of two.

Memory array 200 includes NAND strings 2061 to 206M. Each NAND string includes transistors 2081 to 208N, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string 2061. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
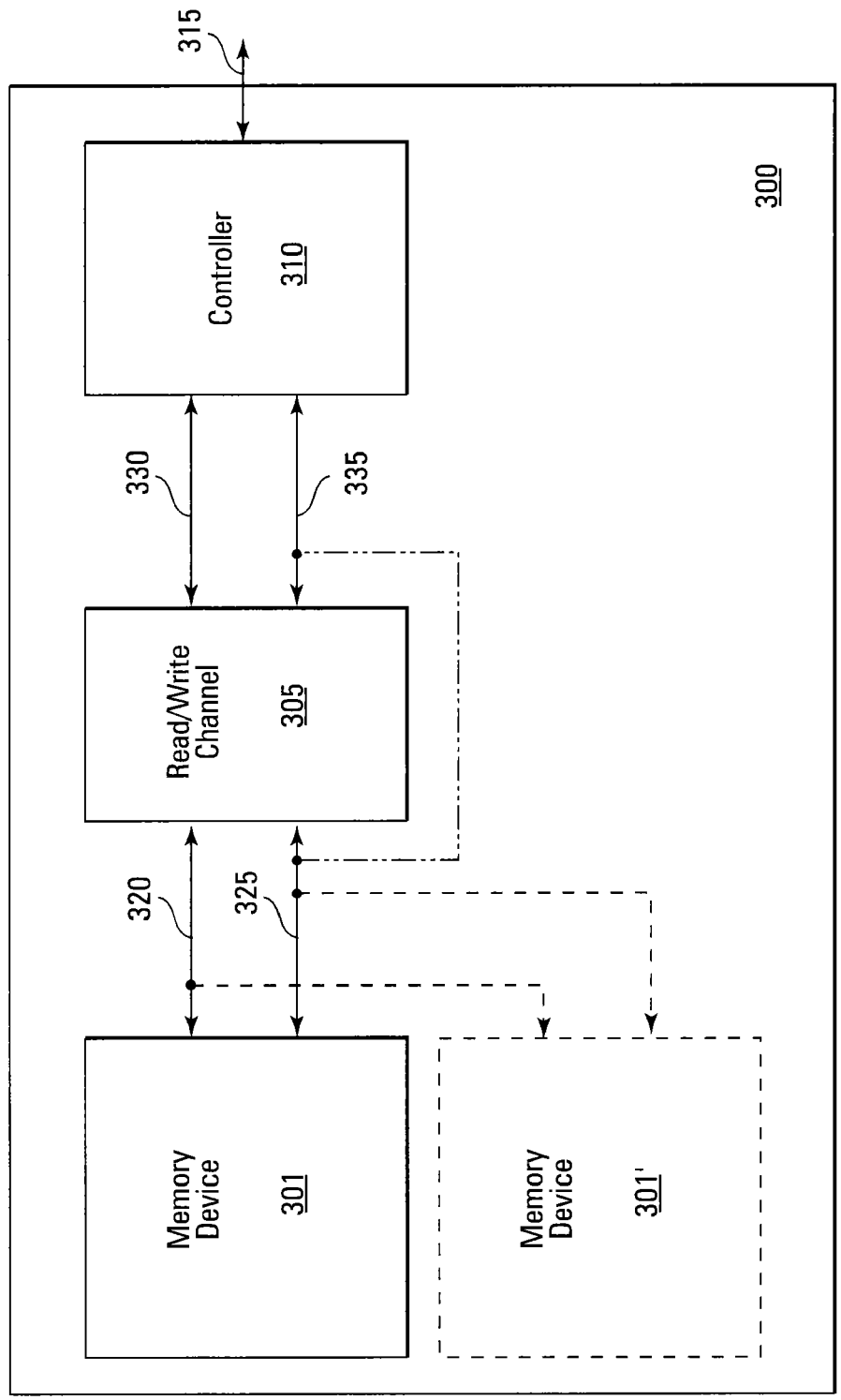
FIG. 3 is a block schematic of a solid state bulk storage system in accordance with one embodiment of the present disclosure.

Memory devices of the various embodiments may be advantageously used in bulk storage systems. For various embodiments, these bulk storage systems may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as cellular telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage system 300 in accordance with one embodiment of the present disclosure.

The bulk storage system 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage system 300 and an external processor (not shown in FIG. 3) through bus interface 315. It is noted that the read/write channel 305 could service one or more additional memory devices, as depicted by memory device 30F in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 310 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage system 300 could be fabricated as a single integrated circuit device.

The read/write channel 305 is a signal processor adapted to at least provide for conversion of a digital data stream to an analog data stream and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage system 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
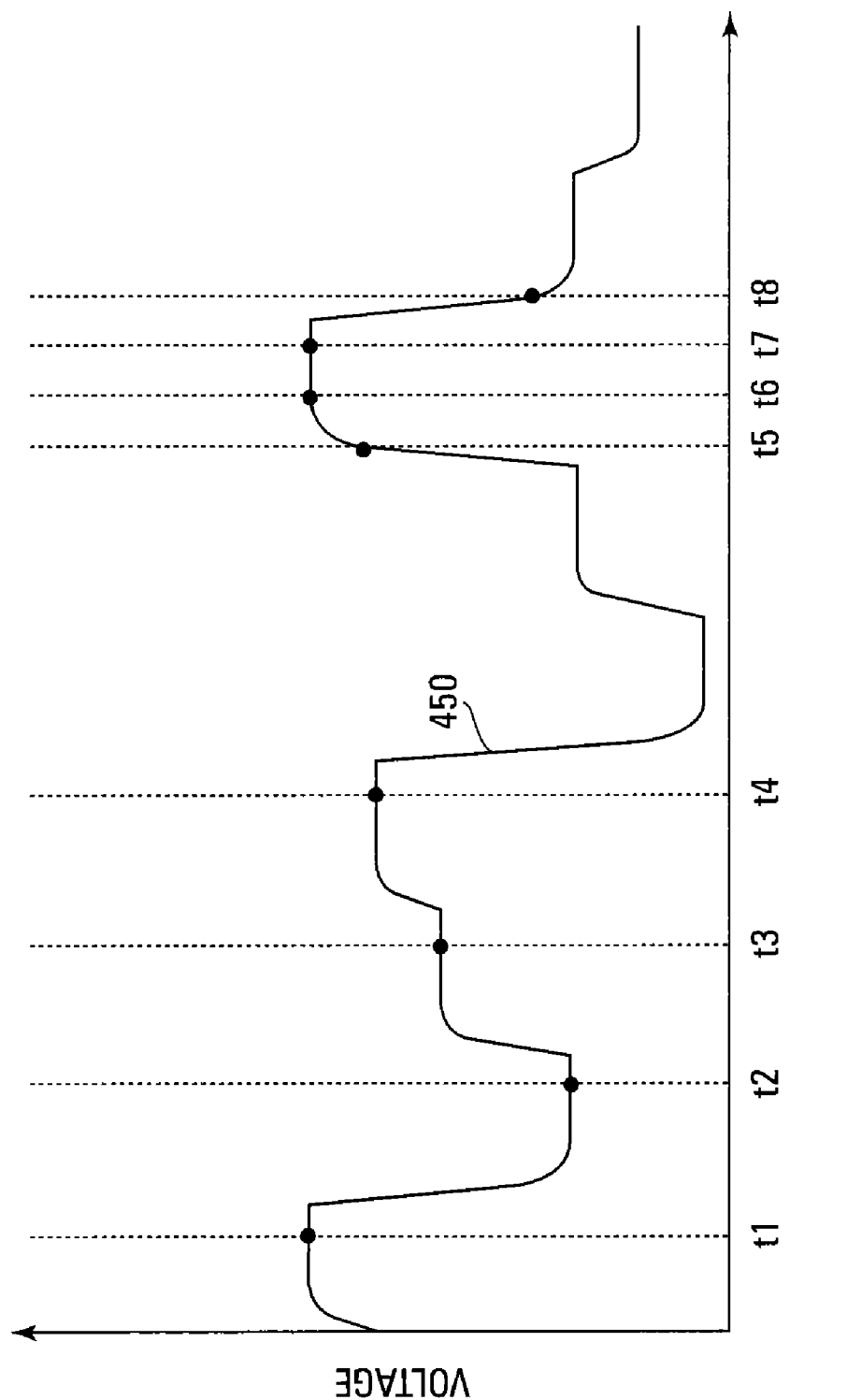
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled, such as is indicated by the dashed lines at times t1, t2, t3 and t4, and a digital representation of the data signal 450 can be created from the amplitudes of the sampled voltage levels. A trade-off is made between sampling rate and accuracy of the representation. The digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
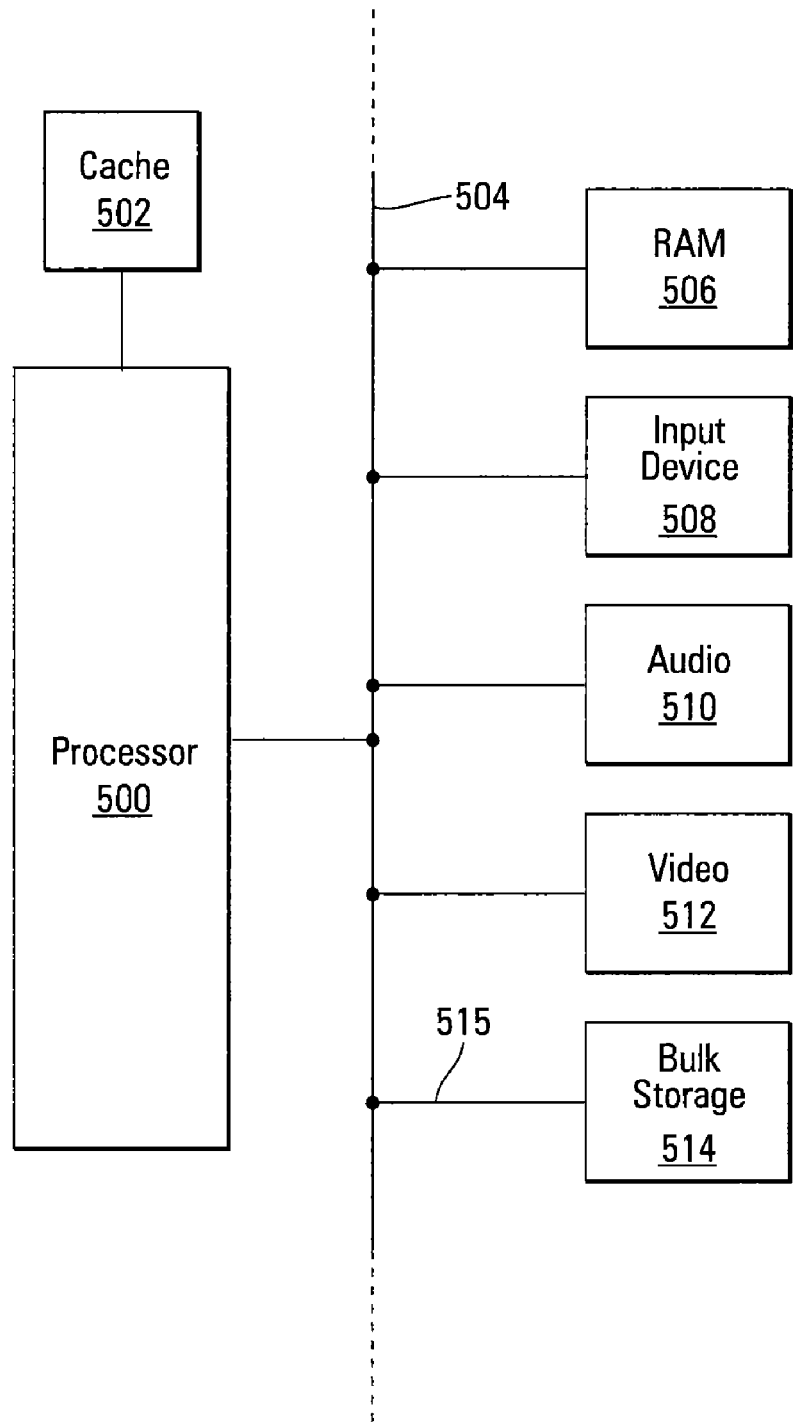
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, cellular telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage systems 514. At least one bulk storage system 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

It is to be understood by those skilled in the art that all data manipulation, programming, and reading can be done in the digital domain without converting the digital data bit patterns to their equivalent analog voltages.

Due to slight differences in the composition of each cell during the fabrication process and the fabrication process itself, cell-to-cell coupling influence can vary from block-to-block across the memory array. The coupling influence can be different between different integrated circuit dies such that two memory devices may not share the same characteristics. Temperature changes can also cause voltage offsets in the read and write paths of a memory device.

Figure 6:
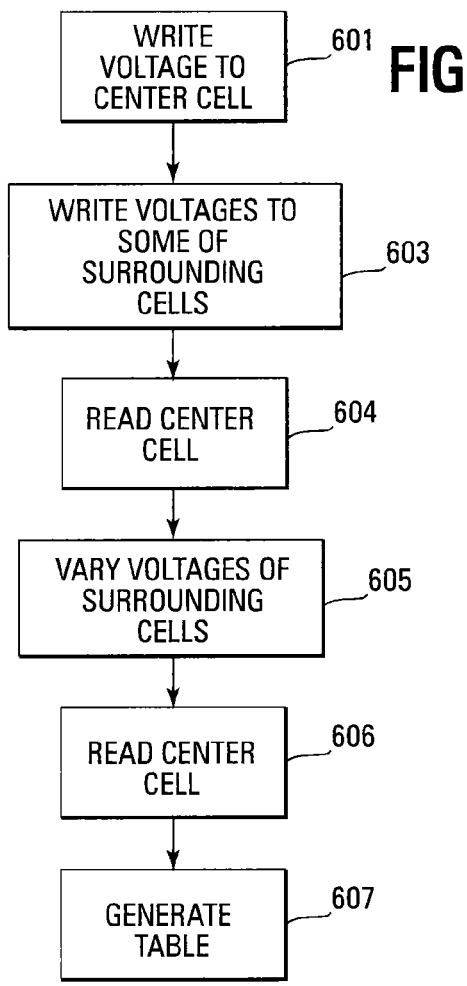
FIG. 6 is a flowchart of one embodiment of a method for calibrating a controller circuit to reliability characteristics of a specific memory device.

FIG. 6 illustrates a flowchart of one embodiment of a method for self-calibration, such as by a memory controller, to the coupling influence of different areas of a memory array. This method enables the controller to determine the cell-to-cell coupling effect in different areas of the memory array, store the resulting programming offset for each area of memory, and use that offset in future programming in each area of memory.

The memory controller or control circuit performing the self-calibration can be part of the memory device (i.e., on the same die as the memory array) or separate from the memory device. One example of a bulk storage memory controller 310 is illustrated in FIG. 3. Subsequent reference to a memory system refers to a memory in either configuration. Reference is made to the block diagram of the partial memory cell array of FIG. 7 while discussing the method of FIG. 6.

The calibration method writes a voltage 601 to the center memory cell 701. The voltage is a threshold voltage that represents a programmed state such as a single bit state or a multiple bit state. As discussed previously, the threshold voltage can be generated by the control circuit, coupled to and controlling the memory device, as a digital signal representative of the desired threshold voltage. A read/write channel circuit and/or controller circuit then performs a digital-to-analog conversion on the digital signal to produce the analog representation of the desired threshold voltage.

A bit pattern represented by another analog voltage is written 603 to one or more of the surrounding memory cells 703, 705. Each adjacent memory cell 703, 705 may be programmed with the same analog voltage or a different analog voltage. The cells 703, 705 adjacent to the center cell 701 and in the word line direction affect the center cell by both capacitive coupling and by program disturb. Programming of the cells 710, 711 along the bit line direction affect the threshold voltage on the center cell 701 by capacitive coupling. These effects tend to raise the threshold voltage of the center cell 701.

The center cell 701 is read 604 after each write operation to determine an effect, such as the extent to which the programming of the surrounding cells has affected the center cell's stored voltage. The voltage on these cells 703, 705 is then varied 605, typically increased, and the center cell is read after each change 606 to determine the effect on the center cell 701. An indication of the effect on the center cell 701 is stored in a table 607 in memory for future reference. In one embodiment, this indication is an offset indicating the average threshold voltage change of the center cell 701 in response to the change in the threshold voltages of the surrounding cells. For example, the offset might be a 5 mV change for every 5V used in programming the surrounding cells. The stored offset can then be used later when programming cells in that area of memory. In another embodiment, the indication of the effect on the center cell is the greatest voltage change that occurs on the center cell in response to of programming one or more of the adjacent cells.

The quantity and orientation of the programmed cells that surround the center cell 701 can vary for different embodiments. For example, vertical cells 710, 711 along the same bit line as the center cell 701, and also diagonal cells, can be programmed and their influence on the center cell 701 can be measured as described above. These effects tend to raise the threshold voltage of the center cell 701.

Figure 7:
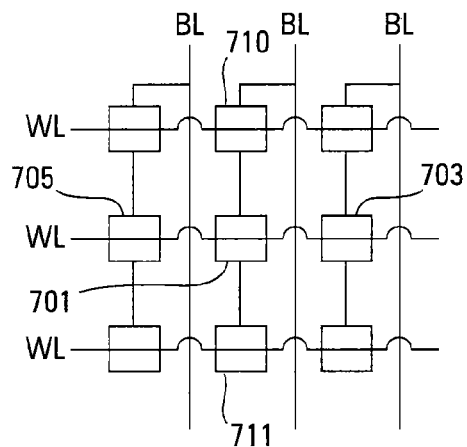
FIG. 7 is a block diagram of one embodiment of a sub-portion of a memory array in accordance with the method of FIG. 6.

The calibration method illustrated in FIGS. 6 and 7 is performed on representative cells of different areas of the memory array. The methods can be performed on random cells of the entire memory array or in specific areas of the array. For example, the methods may be performed on the corner cells of the array and in the center. In another embodiment, certain areas of each memory block can be checked. In still another embodiment, the methods can be performed on cells located at periodic intervals of the memory array.

The self-calibration can be performed once during the manufacturing process and the programming offset indications stored in non-volatile memory. In another embodiment, the calibration is performed at every power-up of the memory device.

In still another embodiment, the self-calibration method is performed during the manufacturing process then the stored offset table is updated at each power-up of the memory device. For example, the offset table stored during manufacture of the device would be a general offset table generated under the manufacturing conditions. Those offsets would be updated due to the changed environmental conditions during actual use of the part.

In yet another embodiment, the stored self-calibration offsets are voltage differences between the results of read and write circuits. For example, a write circuit may write an analog voltage of 2.3V to a memory cell. A read circuit may read this voltage as being 2.35V. Therefore, there is an offset of 0.05V between the voltage that was written and the voltage that was read.

The offset table in one such embodiment is generated by writing a known voltage to a cell and then reading that voltage. The difference is stored as an offset for that particular area of memory. This self-calibration embodiment can perform the write-then-read method on random areas of memory or in a certain pattern as previously described.

Figure 8:
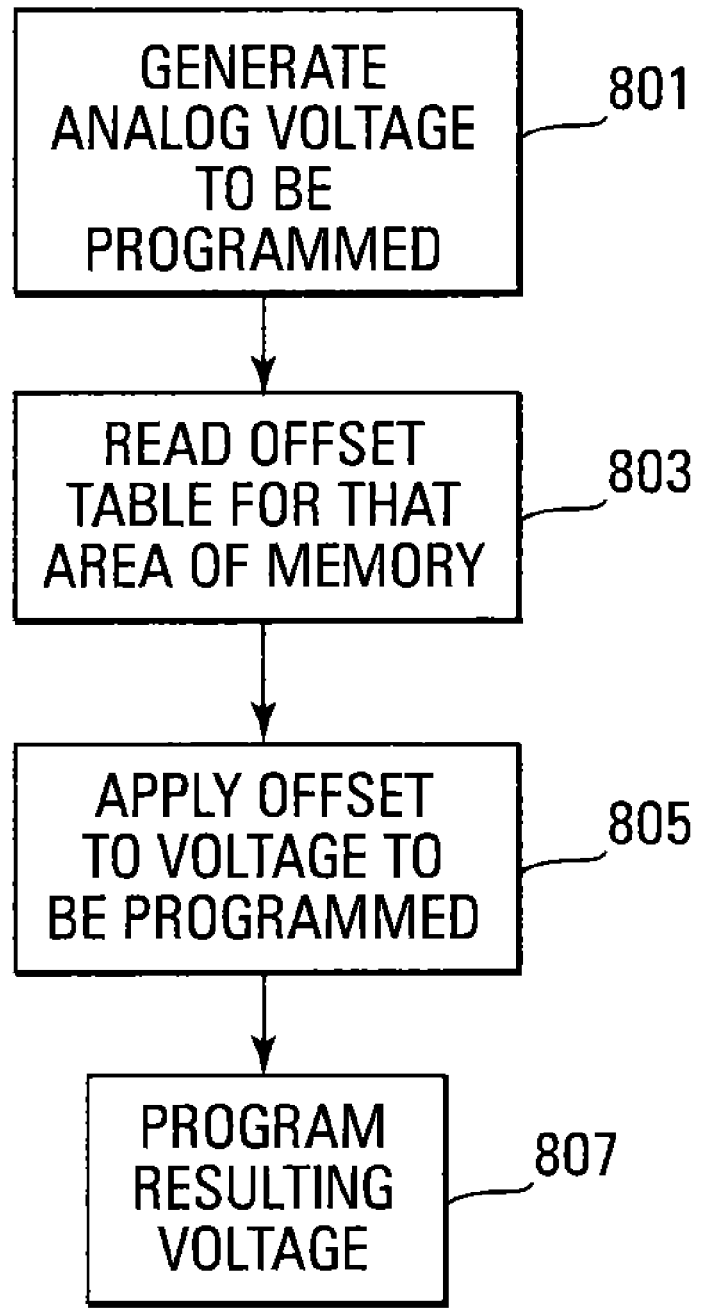
FIG. 8 is a flowchart of one embodiment of a method for programming with a self-calibration offset table generated by the embodiments of FIGS. 6 and 7.

FIG. 8 illustrates one embodiment of a method for programming with the self-calibration offset table generated by the above-described embodiments. The analog voltage to be programmed in a selected memory cell is determined 801. In one embodiment, the voltage is a result of a digital-to-analog conversion process that converts a digital data bit pattern to its equivalent analog voltage.

The offset for the area of memory in which the selected memory cell is located is determined by reading the stored offset for that particular area 803. The offset is then applied to the analog voltage to be programmed 805. For example, if the voltage to be programmed is 1.7V and the offset is 0.03V, the resulting voltage to be programmed is 1.73V. The resulting voltage is then programmed into the selected memory cell 807.

Figure 9:
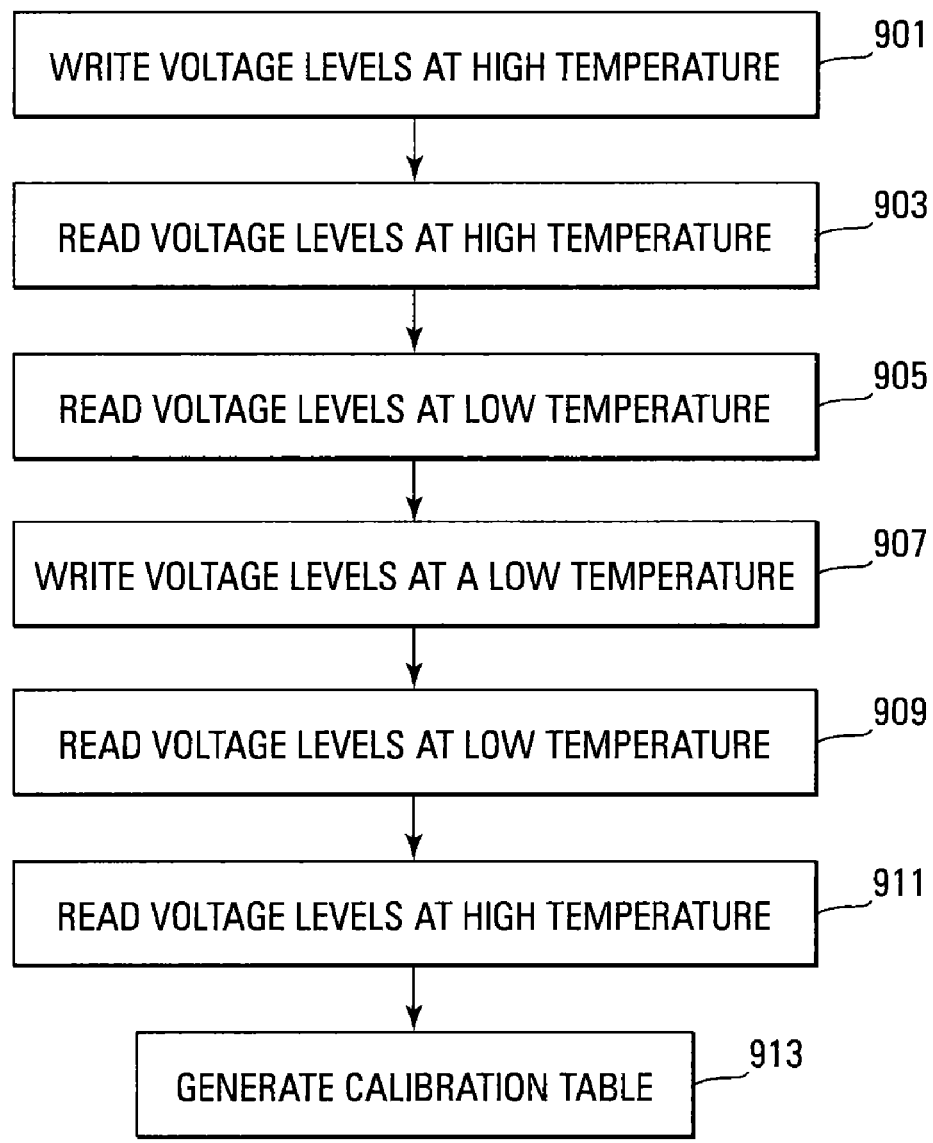
FIG. 9 is a flowchart of one embodiment of a method for calibrating a memory controller circuit for temperature induced systemic offsets in read and write paths of a memory device.

FIG. 9 illustrates one embodiment of a method for calibrating the memory controller to compensate for temperature induced systemic offsets created in the read and write paths of a memory device. This method generates both a write path calibration table and a read path calibration table. Adjustments for intermediate temperatures not included in these tables can be interpolated from the tables.

The method begins with writing a voltage to a memory cell at a relatively high temperature 901. For example, a relatively high temperature might be the upper temperature limit of the operating temperature range of the memory device (e.g., 75°-85° C.). The memory cell is then read at this temperature 903. This read gives the voltage offset experienced between the voltage that was written and the voltage that was read at the higher temperature.

The temperature of the memory device is then reduced and the memory cell that was programmed at the higher temperature is read at a lower temperature 905. In one embodiment, the lower temperature is the lower limit of the operating temperature range of the memory device (e.g., −20°-0° C.). This operation gives the voltage offset experienced between the voltage that was written at the high temperature and then read at a lower temperature.

The same voltage level is then written to the same memory cell (after it is erased) at the lower temperature range 907. This memory cell is then read at the lower temperature range 909. This read gives the voltage offset experienced between the voltage that was written at the lower temperature and the voltage that was read at the lower temperature.

The memory device is then warmed to the high temperature and the memory cell is then read again 911. This read gives the voltage offset experienced between the voltage that was written at the lower temperature and the voltage that is read at the higher temperature.

A calibration table can now be generated 913 from the above offsets at the upper and lower temperature limits. The table can also be filled in with interpolations of voltage offsets at different temperatures between the two temperature extremes. In an alternate embodiment, these interpolations are performed later during the read and write path adjustment methods.

The calibration method of FIG. 9 is performed on representative cells of different areas of the memory array. The methods can be performed on random cells of the entire memory array or in specific areas of the array. For example, the methods may be performed on the corner cells of the array and in the center. In another embodiment, certain areas of each memory block can be checked. In still another embodiment, the methods can be performed on cells located at periodic intervals of the memory array.

Figure 10:
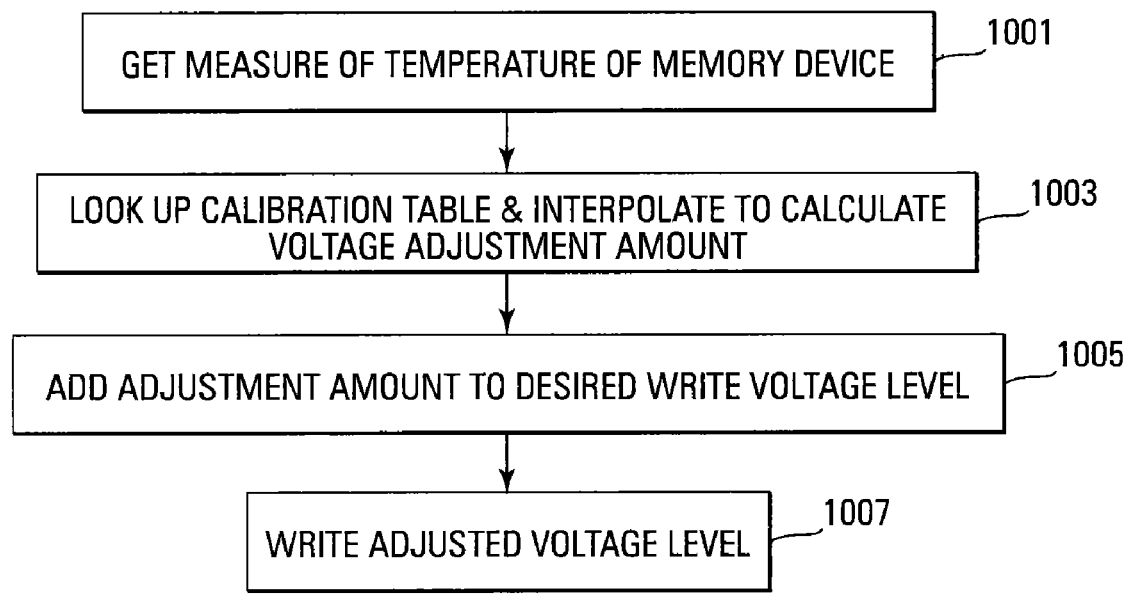
FIG. 10 is a flowchart of one embodiment of a method for performing a write path adjustment in a memory device in accordance with the calibration method of FIG. 8.

FIG. 10 illustrates a flowchart of one embodiment of a method for performing a write path adjustment in a memory device in accordance with the calibration table generated from the embodiment of FIG. 9. The temperature of the memory device is first determined 1001 by using any temperature measurement method. Such a measurement method can include an on-chip temperature sensor or some other measurement technique.

The calibration table is then accessed to find that temperature and the associated voltage offset for that temperature 1003. If that temperature is not in the table, an interpolation between two temperatures and associated offsets in the table can be performed to determine an appropriate voltage offset for that particular temperature. The voltage offset is added to or subtracted from the target write voltage level 1005. As described previously, this voltage level is representative of a bit pattern to be programmed into the selected memory cell. This adjusted voltage level is then programmed into the cell 1007.

Figure 11:
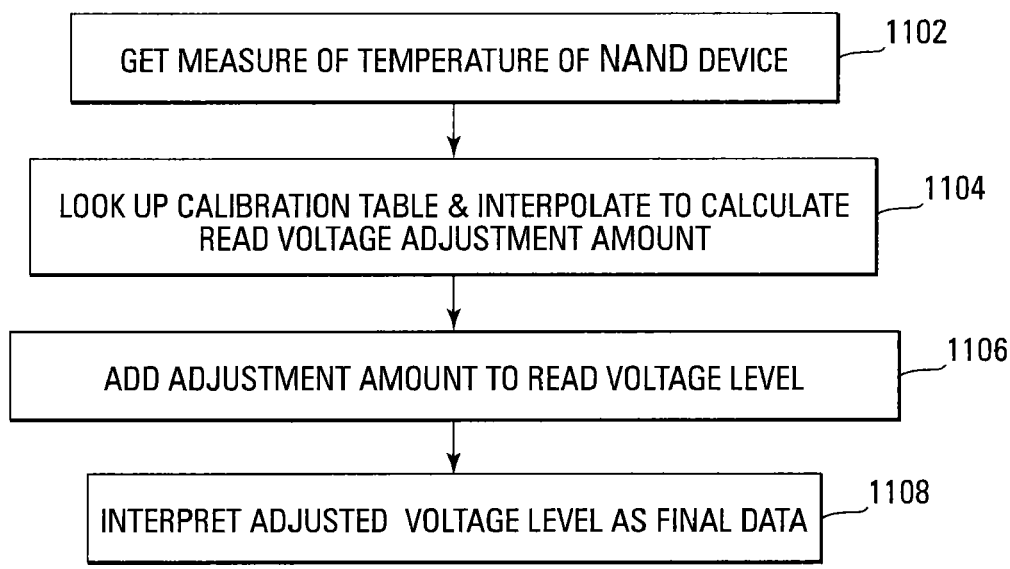
FIG. 11 is a flowchart of one embodiment of a method for performing a read path adjustment in a memory device in accordance with the calibration method of FIG. 8.

FIG. 11 illustrates a flowchart of one embodiment of a method for performing a read path adjustment in a memory device in accordance with the calibration table generated from the embodiment of FIG. 9. The temperature of the memory device is first determined 1102 by using any temperature measurement method. Such a measurement method can include an on-chip temperature sensor or some other measurement technique.

The calibration table is then accessed to find that temperature and the associated voltage offset for that temperature 1104. If that temperature is not in the table, an interpolation between two temperatures and associated offsets in the table can be performed to determine an appropriate voltage offset for that particular temperature.

The voltage offset is added to or subtracted from the voltage that is read from the memory cell 1106. This adjusted voltage level is used by the analog-to-digital conversion process described above in determining the bit pattern represented by the analog voltage that was stored on the memory cell 1108.

It is to be understood by those skilled in the art that all data manipulation, programming and read can be done in the digital domain without converting the digital data bit patterns to their equivalent analog voltages.

CONCLUSION

One or more of the disclosed embodiments store an offset in memory that is added to a voltage to be programmed prior to programming the selected memory cell. For example, in one embodiment self-calibration determines an offset that results from the influence of programming surrounding cells or differences between write and read circuitry. In another embodiment, self-calibration determines an offset that results from temperature induced systemic offsets created in the read and write paths of the memory device. These offsets are applied to the voltages to be programmed in certain areas of memory (e.g., each block, corners and center of the array) as those areas are being programmed.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure. It is also to be understood that although calibration methods are presented as analog voltage storage in non-volatile cells the same can be applied to digital data pattern equivalent to analog voltages.

What is claimed is:

1. A method comprising:
    determining a programming offset responsive to a coupling effect in a particular area of a memory array;
    storing the programming offset; and
    using the programming offset for programming in the particular area of the memory array.

2. A controller configured to:
    determine a programming offset responsive to a coupling effect in a particular area of a memory array;
    store the programming offset; and
    use the programming offset for programming in the particular area of the memory array.

3. A method comprising:
    programming a selected memory cell;
    programming an adjacent memory cell, wherein the adjacent memory cell is adjacent to the selected memory cell;
    determining an effect of programming the adjacent memory cell on the selected memory cell; and
    storing an indication of the effect in a table.

4. The method of claim 3, further comprising:
    reading the selected memory cell after programming the selected memory cell and before programming the adjacent memory cell; and
    reading the selected memory cell after programming the adjacent memory cell,
    wherein the effect of programming the adjacent memory cell on the selected memory cell comprises a difference between the readings.

5. The method of claim 3, wherein the effect comprises a change in threshold voltage of the selected memory cell.

6. The method of claim 3, wherein programming an adjacent memory cell comprises programming a plurality of adjacent memory cells and wherein determining an effect of programming the adjacent memory cell on the selected memory cell comprises determining an effect of programming the plurality of adjacent memory cells on the selected memory cell.

7. The method of claim 6, wherein the plurality of adjacent memory cells are programmed with a same voltage.

8. The method of claim 3, wherein programming an adjacent memory cell comprises programming the adjacent memory cell to a voltage, the method further comprising varying the voltage of the adjacent memory cell and determining an effect of varying the voltage of the adjacent memory cell on the selected memory cell.

9. The method of claim 3, wherein the indication of the effect stored in the table comprises an offset indicating an average threshold voltage change of the selected memory cell in response to a change in the threshold voltage of the adjacent memory cell.

10. The method of claim 3, wherein the indication of the effect stored in the table comprises a greatest voltage change that occurred on the selected memory cell in response to programming the adjacent memory cell.

11. The method of claim 3, further comprising:
    programming another selected memory cell in a different area of a memory array than an area of the memory array including the selected memory cell;
    after programming the other selected memory cell, programming another adjacent memory cell, wherein the other adjacent memory cell is adjacent to the other selected memory cell;
    determining an effect of programming the other adjacent memory cell on the other selected memory cell; and
    storing an indication of the effect of programming the other adjacent memory cell on the other selected memory cell in a table.

12. The method of claim 3, wherein storing an indication of the effect in a table comprises updating the table.

13. The method of claim 3, further comprising using the indication of the effect when programming memory cells in an area of a memory array including the selected memory cell.

14. A method comprising:
    writing a write voltage to a memory cell in a particular area of a memory array;
    determining a read voltage of the memory cell;
    determining a difference between the write voltage and the read voltage; and
    storing the difference as an offset for the particular area.

15. A method comprising:
    determining an offset for an area of a memory array in which a memory cell is located;
    applying the offset to a target voltage to be programmed in the memory cell; and
    programming an adjusted voltage into the memory cell, wherein the adjusted voltage comprises a voltage resulting from applying the offset to the target voltage.

16. The method of claim 15, wherein determining an offset comprises reading a stored offset for the area from a table.

17. A method for performing a write path adjustment, the method comprising:
    determining a temperature of a memory device;
    determining an offset associated with the determined temperature;
    applying the offset to a target voltage for a memory cell of the memory device; and
    programming an adjusted voltage into the memory cell, wherein the adjusted voltage comprises a voltage resulting from applying the offset to the target voltage.

18. The method of claim 17, wherein determining an offset associated with the determined temperature comprises accessing a calibration table to determine the offset.

19. The method of claim 18, wherein determining an offset for the determined temperature further comprises interpolating between two temperatures and associated offsets in the calibration table to determine the offset associated with the determined temperature.

20. A method for performing a read path adjustment, the method comprising:

determining a temperature of a memory device;
determining an offset associated with the determined temperature; and
applying the offset to a voltage read from a memory cell of the memory device.

21. The method of claim 20, wherein determining an offset associated with the determined temperature comprises accessing a calibration table to determine the offset.

22. The method of claim 21, wherein determining an offset associated with the determined temperature further comprises interpolating between two temperatures and associated offsets in the calibration table to determine the offset associated with the determined temperature.

* * * * *